US009255970B2

(12) United States Patent  
Neti et al.

(10) Patent No.: US 9,255,970 B2
(45) Date of Patent: Feb. 9, 2016

(54) ON-LINE MONITORING OF STATOR INSULATION IN MOTORS AND GENERATORS

(71) Applicant: General Electric Company, Schenectady, NY (US)

(72) Inventors: Prabhakar Neti, Rexford, NY (US); Karim Younsi, Ballston Lake, NY (US); Yingneng Zhou, Niskayuna, NY (US); Manoj Ramprasad Shah, Latham, NY (US); Pinjia Zhang, Clifton Park, NY (US); Charles David Whitefield, II, Carson City, UT (US)

(73) Assignee: GENERAL ELECTRIC COMPANY, Niskayuna, NY (US)

( * ) Notice: Subject to any disclaimer, the term of this patent is extended or adjusted under 35 U.S.C. 154(b) by 557 days.

(21) Appl. No.: 13/629,206

(22) Filed: Sep. 27, 2012

(65) Prior Publication Data

US 2014/0084937 A1    Mar. 27, 2014

(51) Int. Cl.
*H01H 31/12* (2006.01)
*G01R 31/34* (2006.01)
*G01R 31/12* (2006.01)

(52) U.S. Cl.
CPC .......... *G01R 31/343* (2013.01); *G01R 31/1272* (2013.01); *G01R 31/346* (2013.01)

(58) Field of Classification Search
CPC . G01R 31/343; G01R 31/1272; G01R 31/346
USPC .................... 324/510, 551, 765.01
See application file for complete search history.

(56) References Cited

U.S. PATENT DOCUMENTS

| 4,716,487 | A | 12/1987 | Horvath et al. |
| 4,766,387 | A | 8/1988 | Browne et al. |
| 5,612,601 | A | 3/1997 | Kuecker et al. |
| 6,137,418 | A | 10/2000 | Zuercher et al. |
| 6,320,731 | B1 | 11/2001 | Eaves et al. |

(Continued)

FOREIGN PATENT DOCUMENTS

JP    2002139535 A    5/2002

OTHER PUBLICATIONS

Lee, Sang Bin, et al.; "An On-line Groundwall and Phase to Phase Insulation Quality Assessment Technique for AC Machine Stator Windings", Industry Applications Conference, 40th IAS Annual Meeting, Issue date: Oct. 2-6, 2005, vol. 1, pp. 10-19.

*Primary Examiner* — Jermele M Hollington
*Assistant Examiner* — Farhana Hoque
(74) *Attorney, Agent, or Firm* — Fletcher Yoder, P.C.

(57) ABSTRACT

Systems and methods are disclosed for on-line monitoring of the condition of the stator insulation of an AC motor or an electric generator. In certain embodiments, the system includes a transformer surrounding each pair of input and output cables associated with a given phase of power provided to the AC motor or generated by the electric generator. In another embodiment, a transformer surrounds the three input cables (for an AC motor) or the three output cables (for an electric generator) that correspond to phases of the AC motor or electric generator. In both embodiments, the transformers generate voltages that may be used to monitor leakage currents associated with the cables. A microcontroller monitors the voltages generated by the transformers and determines the condition of the stator insulation of the AC motor or the electric generator based on the voltages.

17 Claims, 8 Drawing Sheets

(56) References Cited

U.S. PATENT DOCUMENTS

| | | |
|---|---|---|
| 6,323,658 B1 | 11/2001 | Kindig et al. |
| 6,636,823 B1 | 10/2003 | Unsworth et al. |
| 2003/0178999 A1 | 9/2003 | Klingel |
| 2005/0218906 A1* | 10/2005 | Younsi et al. .................. 324/551 |
| 2006/0259271 A1* | 11/2006 | House et al. .................. 702/181 |
| 2010/0148907 A1* | 6/2010 | Younsi et al. .................. 336/180 |
| 2010/0156338 A1 | 6/2010 | Lu et al. |
| 2010/0295491 A1 | 11/2010 | Schulz et al. |
| 2010/0315095 A1 | 12/2010 | Younsi et al. |
| 2011/0006755 A1 | 1/2011 | Younsi et al. |
| 2011/0006802 A1* | 1/2011 | Younsi ................ G01R 15/185 324/765.01 |
| 2011/0296989 A1 | 12/2011 | Taylor et al. |

\* cited by examiner

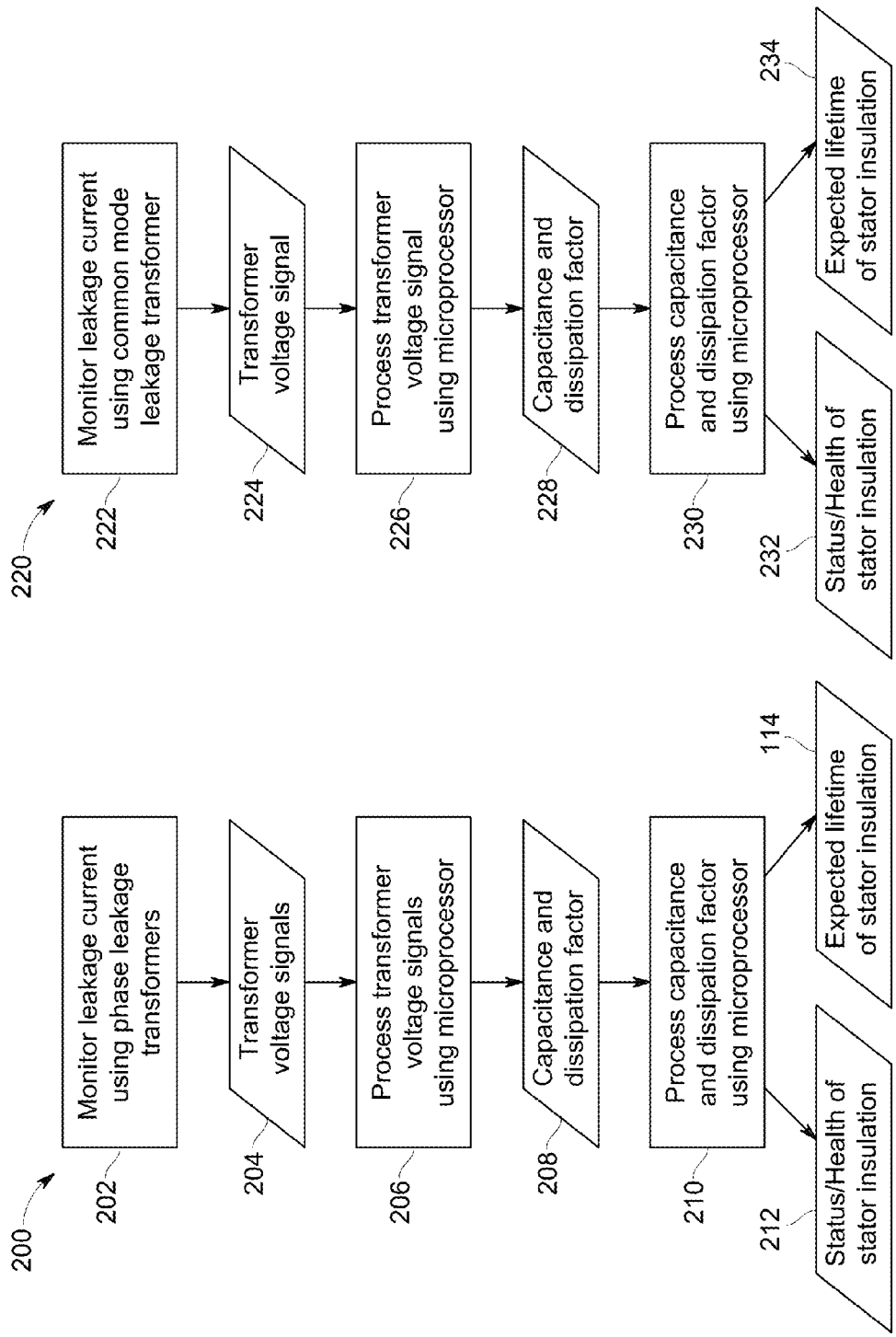

ON-LINE MONITORING OF STATOR INSULATION IN MOTORS AND GENERATORS

BACKGROUND

The subject matter disclosed herein relates to electric generators and variable speed drive fed AC motors.

Variable speed drive (VSD) fed AC motors utilize a VSD controller to control the speed and torque of an AC motor (such as to drive a load or perform other useful work) by varying the frequency and voltage of input signals to the AC motor. Using similar physical principals, electric generators are used to convert mechanical energy into electrical energy, such as for driving a motor or other electrically powered device. Both AC motors and electric generators include stator insulation to prevent current from flowing from the rotational components of the device through the stationary components of the device. Over time, the resistance of the stator insulation in electric generators and VSD-fed AC motors degrade. The stator insulation resistance may eventually degrade to the point where the operation of the AC motor or the electric generator is severely impaired or, in extreme instances, the AC motor or the electric generator may even be rendered inoperable.

While techniques have been developed to determine the health of stator insulation of electric generators and AC motors, such techniques typically are performed with the generator or motor in an off-line state. That is, the motor cannot be operated while the needed measurements are taken, making such monitoring approaches inconvenient and inefficient.

BRIEF DESCRIPTION

In one embodiment an electronic system is provided. The electronic system comprises a first current transformer configured to enclose a first pair of phase cables of a variable speed drive (VSD) fed AC motor or electric generator, a second current transformer configured to enclose a second pair of phase cables of the VSD-fed AC motor or electric generator, and a third current transformer configured to enclose a third pair of phase cables of the VSD-fed AC motor or electric generator. The electronic system further comprises a microcontroller configured to monitor respective voltages generated by the first, second, and third transformers, and to determine insulation characteristics of the VSD-fed AC motor or electric generator based on the monitored leakage currents.

In a further embodiment, a method is provided for monitoring the condition of insulation in an AC motor or electric generator. The method includes the acts of enclosing a first pair of phase cables of the AC motor or electric generator with a first transformer that generates a first voltage corresponding to a first leakage current, when present, in the first pair of phase cables, enclosing a second pair of phase cables of the AC motor or electric generator with a second transformer that generates a second voltage corresponding to a second leakage current, when present, in the second pair of phase cables, and enclosing a third pair of phase cables of the AC motor or electric generator with a third transformer that generates a third voltage corresponding to a third leakage current, when present, in the third pair of phase cables. The method also includes the act of monitoring the first, second, and third voltages generated, respectively, by the first, second, and third transformers with a microcontroller to determine the condition of the insulation in the AC motor or electric generator.

In another embodiment, an electronic system is provided. The electronic system comprises an AC motor and a power converter configured to provide power to the AC motor over three phase input cables. The power converter is configured to vary the frequency and amplitude of the power to control the torque and speed of the AC motor. The electronic system also comprises a current transformer configured to enclose the first, second, and third phase input cables of the AC motor and to generate a voltage corresponding to a leakage current associated with the AC motor. A microcontroller is configured to monitor the voltage generated by the transformer, to determine a frequency response of an insulation of the AC motor, and to process the frequency response of the insulation to obtain insulation characteristics of the AC motor.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein:

FIG. 11 is a flowchart showing the data collection and analysis process for phase monitoring in accordance with certain embodiments of the present disclosure; and FIG. 12 is a flowchart showing the data collection and analysis process for common mode monitoring in accordance with certain embodiments of the present disclosure.

DETAILED DESCRIPTION

Figure 1:
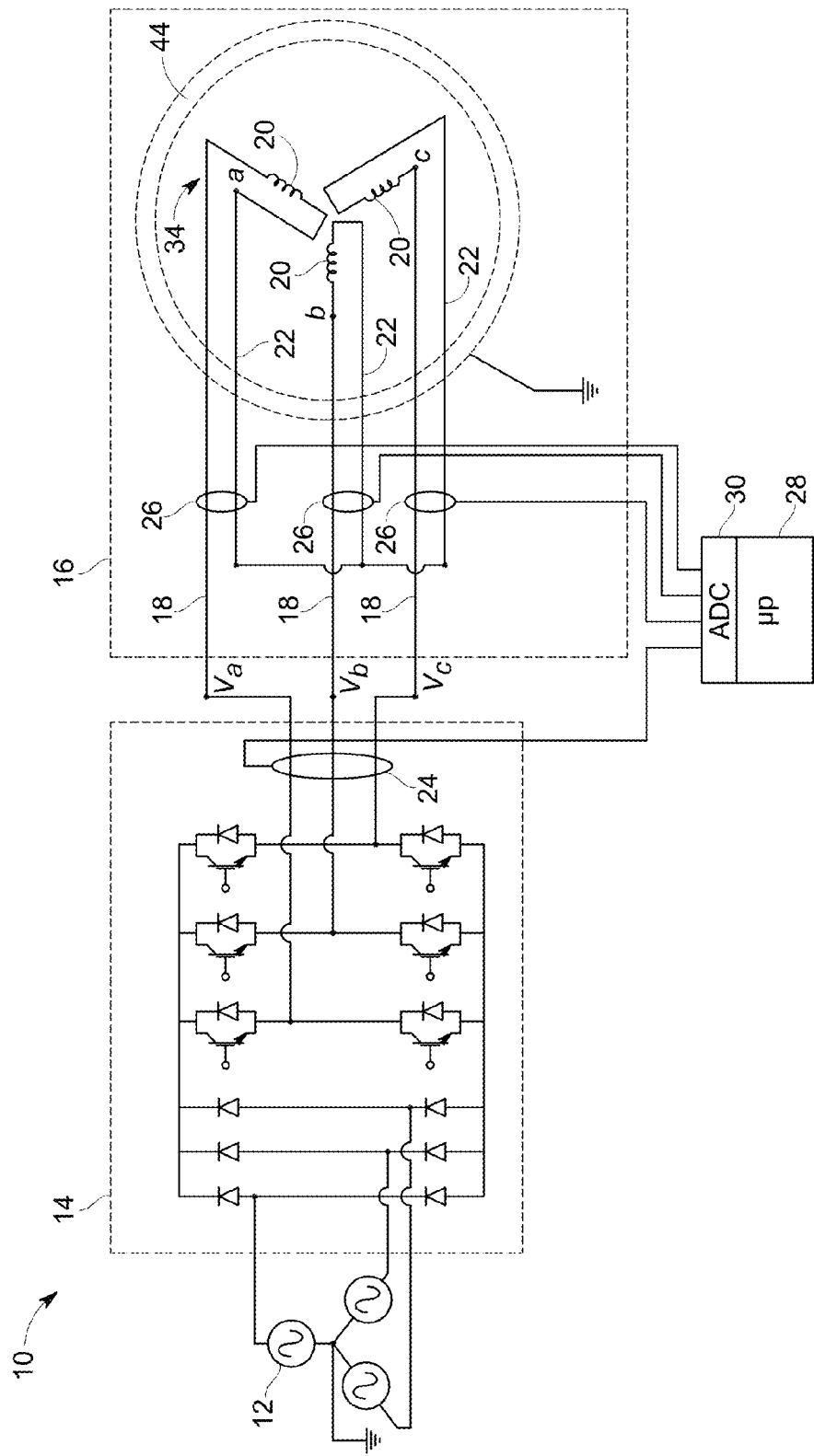
FIG. 1 is a system-level diagram of an on-line capacitance and dissipation factor measurement system in accordance with certain embodiments of the present disclosure.

One or more specific embodiments will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present invention, the articles "a," "an," "the," and "said" are intended to mean that there are one or more of the elements. The terms "comprising," "including," and "having" are intended to be inclusive and mean that there may be additional elements other than the listed elements.

Aspects of the present disclosure relate to an electronic system configured to monitor the condition of stator insulation in an AC motor or electric generator while the AC motor or electric generator remains on-line. In one embodiment, an operator of a motor or generator can monitor the health and expected lifetime of an AC motor or electric generator without the inconvenience and inefficiency of having to take the motor off-line. Certain embodiments will also allow for continuous monitoring of the stator insulation condition. In one implementation, the stator insulation monitoring system uses three transformers, each respectively enclosing a phase specific pair of wires (i.e., an input and output wire) of the AC motor or electric generator. The transformers generate a voltage based on the leakage current that occurs on each phase of the AC motor or electric generator. The voltage detected by each transformer may be analyzed, such as by using a processing component or processor, to determine a capacitance and dissipation factor for a given stator insulation. In certain implementations, the capacitance and dissipation factors may be used to determine the condition of the stator insulation. In one embodiment, such determinations include determining an expected remaining lifetime of the stator insulation.

In a further embodiment, as discussed herein, a transformer may also be utilized, alone or in conjunction with the phase leakage current transformers mentioned above, that encloses the three phase input wires to an AC motor (i.e., all three phases) and generates a voltage based on the total leakage current flowing into the AC motor. The measured voltage may be analyzed by a processor to provide data related to stator insulation condition, as discussed herein.

Similarly, in a related embodiment, a transformer may also be utilized, alone or in conjunction with the phase leakage current transformers mentioned above, that encloses all of the output wires of an electric generator and generates a voltage based on the total leakage current flowing from the electric generator circuitry, through the stator insulation, and into the frame of the electric generator. As in the embodiment with the AC motor, the measured voltage may be analyzed by a processor to provide data related to stator insulation condition, as discussed herein.

With the foregoing in mind, FIG. 1 illustrates a system-level diagram of an on-line capacitance and dissipation factor measurement system in accordance with certain embodiments. In the depicted example, a VSD-fed AC motor 10 includes a three phase power source 12. The three phase power source 12 may provide three phase current to a power converter (drive) 14. The power converter 14 may include circuitry (e.g., switching circuitry and so forth) configured to allow control of an AC motor 16 by varying the frequency and amplitude of the three phase current. The power converter 14 may thereby allow control of the torque and the speed of the rotation of the AC motor 16. The three phase current may flow from the power converter 14 through input cables 18 (in the depicted example, one input cable 18 for each phase) into the AC motor 16. In the AC motor 16, each of the three phases of the three phase current may flow from a respective input cable 18 (i.e., each cable 18 corresponds to a different phase), through one of three motor induction loads 20, and out through one of each corresponding phase-specific output cables 22. A stator insulation 34 (i.e., insulation associated with the stationary component of the motor 10) electrically separates the current flowing through the respective cables from a frame 44 of the motor 10.

In the depicted embodiment, a common-mode leakage transformer 24 encloses all three of the input cables 18. In this example, the common-mode leakage transformer 24 generates a voltage based on changes in magnetic flux generated by the three input cables 18 at different respective phases. Changes in the magnetic flux may be caused by increases or decreases in the respective currents flowing through the three input cables 18 at the respective phases.

Also depicted in FIG. 1, a phase leakage transformer 26 may respectively enclose each of the paired of input cables 18 and output cables 22 for a respective phase. Each phase leakage transformer 26 may generate a voltage based on changes in magnetic flux generated by the respective input cable 18 and output cable 22 of a given phase associated with a phase leakage transformer 26. Changes in the magnetic flux may be caused by increases or decreases in the currents flowing through a pair of input cables 18 and output cables 22 at a given phase. Changes in the magnetic flux may also be caused by different amplitudes of current flowing on one of the three input cables 18 and the corresponding output cables 22. In the depicted embodiment, a microprocessor 28 may be used to measure the voltages generated by the common-mode leakage transformer 24 and/or the three phase leakage transformers 26. Signals processed by the processor 28 may be converted from analog to digital form prior to processing, such as by use of an analog to digital converter (ADC) 30. For example, in one implementation, the microprocessor 28 may analyze recorded voltages generated by one or more of the transformers to determine the capacitance and dissipation factors associated with the stator insulation 34 in the AC motor 16.

Figure 2:
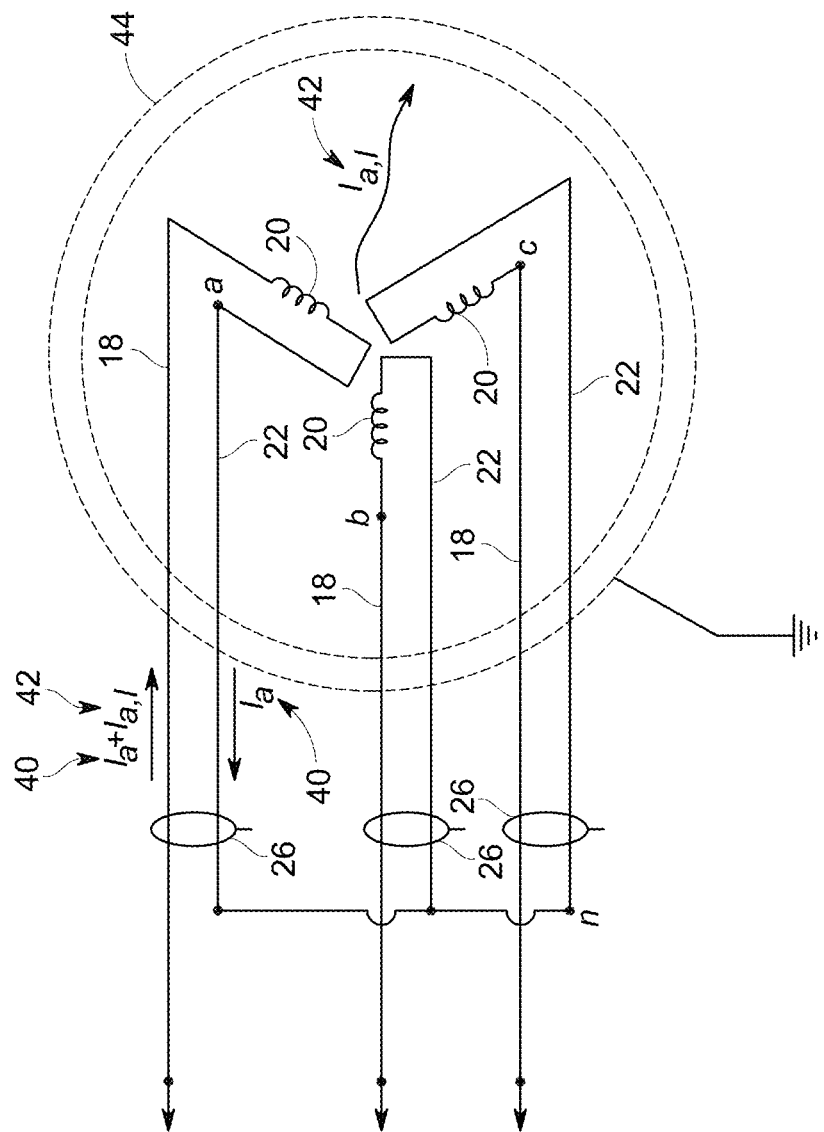
FIG. 2 is a detailed diagram of a portion of the system of FIG. 1 in accordance with certain embodiments of the present disclosure.

FIG. 2 provides a detailed view of the currents flowing through the AC motor 16. In this example, phase specific currents may enter the AC motor 16 on one of three respective input cables 18. The phase specific current by carried by each of the respective input cables 18 may be measured by a phase leakage transformer 26 through which the respective input cable 18 passes. The total phase current on an input cable 18 may be considered as including different respective constituents, such as a load current 40 and a leakage current 42. Each phase current may flow through one of the three motor induction loads 20. While the phase current flows through the respective motor induction load 20, a leakage current 42 (if present) may flow out of the motor induction load 20, such as through the stator insulation 34 and into the grounded frame 44 of the AC motor 16. An increase in leakage current 42 may, therefore, indicate increasingly unhealthy or deteriorating stator insulation 34. The remaining load current 40 may flow through the respective output cable 22 for the phase and back out through the respective phase leakage transformer 26.

An increase in leakage current 42 may cause a change in magnetic flux generated by a paired input cable 18 and output cable 22. For example, an increase in leakage current 42 may cause a difference in the amplitude of the current flowing through the phase leakage transformer 26 towards the AC motor 16 in the respective input cable 18 relative to the amplitude of the current flowing through the phase leakage transformer 26 away from the AC motor 16 in the respective output cable 22. The difference in amplitudes of currents flowing in the respective input cable 18 and the respective output cable 22 may generate an asymmetric flux about a paired input cable 18 and output cable 22. The asymmetric flux may in turn, when monitored by a respective phase leakage transformer 26, give rise to a voltage at the phase leakage transformer that may be processed with the microprocessor 28.

Figure 3:
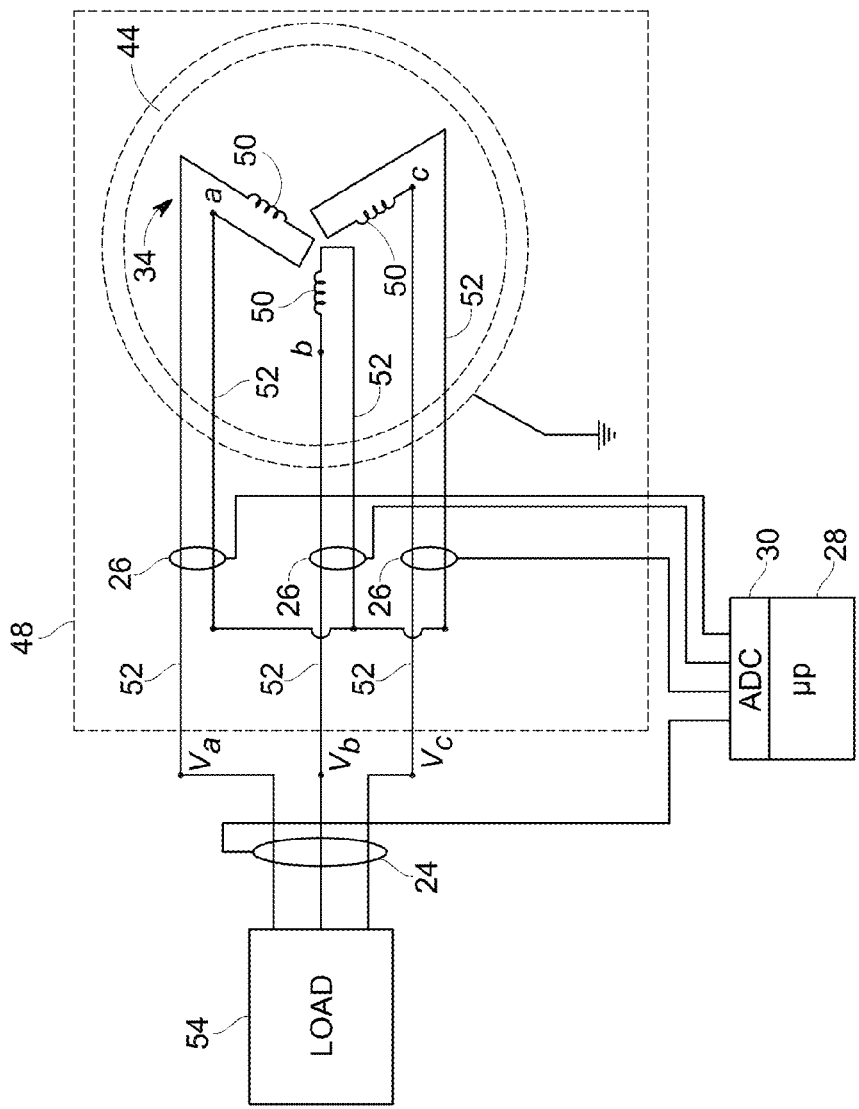
FIG. 3 is a further system-level diagram of an on-line capacitance and dissipation factor measurement system in accordance with certain embodiments of the present disclosure.

While FIGS. 1 and 2 illustrate on-line stator monitoring techniques for an AC motor 16, FIG. 3 illustrates how similar on-line stator monitoring techniques may be applied to an electric generator 48. In such an embodiment, a mechanical force may cause a magnetic field to move in relation to generator inductors 50 to cause a current to flow in paired generator cables 52. The current flowing through the paired generator cables 52 may provide electric power to a load 54 connected to the electric generator. As in the embodiment illustrated in FIG. 1, each phase leakage transformer 26 may enclose a pair of generator cables 52 at a given phase and generate voltages based on changes in the magnetic flux surrounding the paired generator cables 52. The changes in magnetic flux may be caused by increases in leakage currents as describe in FIG. 2, and may indicate increasingly unhealthy or deteriorating stator insulation. Likewise, a common-mode leakage transformer 24 operates in the same manner as described in FIG. 1, generating a voltage based on changes in magnetic flux surrounding the generator cables 52 of each phase. As described above, the changes in magnetic flux may be caused by increases in leakage currents flowing from the generator inductors 50, through the stator insulation 34, and into the grounded frame 44 of the electric generator 48.

Figure 4:
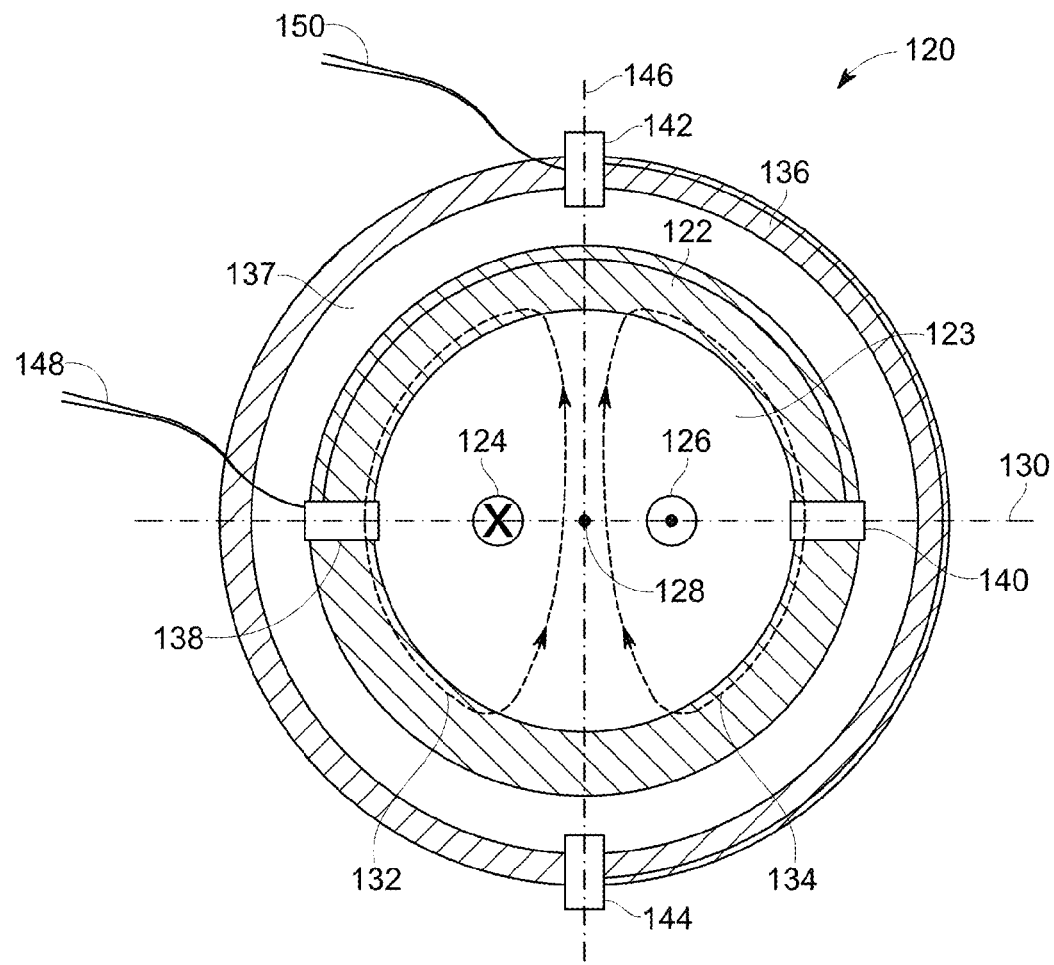
FIG. 4 is a diagrammatic illustration of a high sensitivity differential current transformer in accordance with certain embodiments of the present disclosure.

In an embodiment of the present disclosure, the phase leakage transformers 26 illustrated in FIGS. 1, 2, and 3 may be dual core high sensitivity differential current transformers (HSCTs). Additionally, in some embodiments, the common-mode leakage transformer 24 may be a HSCT. Use of HSCTs may facilitate the measurement of relatively small differences (e.g., 100 microamperes) in relatively large currents (e.g., several kiloamperes). Turning to the figures, FIG. 4 illustrates a dual core HSCT 120 in accordance with an embodiment of the present disclosure. In the depicted example, an inner magnetic core 122 may define a central opening 123 of the HSCT 120. A first conductor 124 and a second conductor 126 may extend through the central opening 123. The pair of conductors may be positioned equidistant from a center point 128 of the inner magnetic core 122 and on a diameter of the inner magnetic core 122, referred to as a reference axis 130. The first conductor 124 and the second conductor 126 may carry currents that are substantially equal in magnitude but opposite in direction (e.g., currents that are equal or which differ in magnitude in the amount of a leakage current). The currents flowing in the first conductor 124 and the second conductor 126 may generate magnetic fluxes 132, 134 around the conductor.

In one embodiment, the HSCT 120 may include a sense core 136 that encircles the inner magnetic core 122 and defines an air gap 137 between itself and the inner magnetic core 122. The inner magnetic core 122 and the sense core 136 may be formed using a variety of materials such as silicon steel, ferro alloys, ferrites, or combinations thereof. One or both of the inner magnetic core 122 and the sense core 136 may include one or more sense coils 138, 140, 142, 144. In the depicted example, the sense coils 138, 140 on the inner magnetic core 122 are disposed along a magnetic neutral axis (MNA) 146. The MNA 146 may be formed as a result of opposing magnetic fluxes 132, 134. In another embodiment, the sense coils 138, 140, of the inner magnetic core 122 may be disposed on the reference axis 130. The sense coils 142, 144 on the sense core 136 may be disposed on the MNA 146, as illustrated, though in other implementations the sense coils 142, 144 on the sense core 136 may be positioned at any location on the sense core 136, i.e., the sense coils 142, 144 need not be positioned on the MNA 146 or reference axis but may be positioned anywhere on the sense core 136. As discussed in certain embodiments herein, terminals 148, 150 may connect to a microprocessor 28 through an ADC 30 (see FIG. 1) to measure a leakage current flowing in the first conductor 124 or the second conductor 126.

Figures 5, 6:
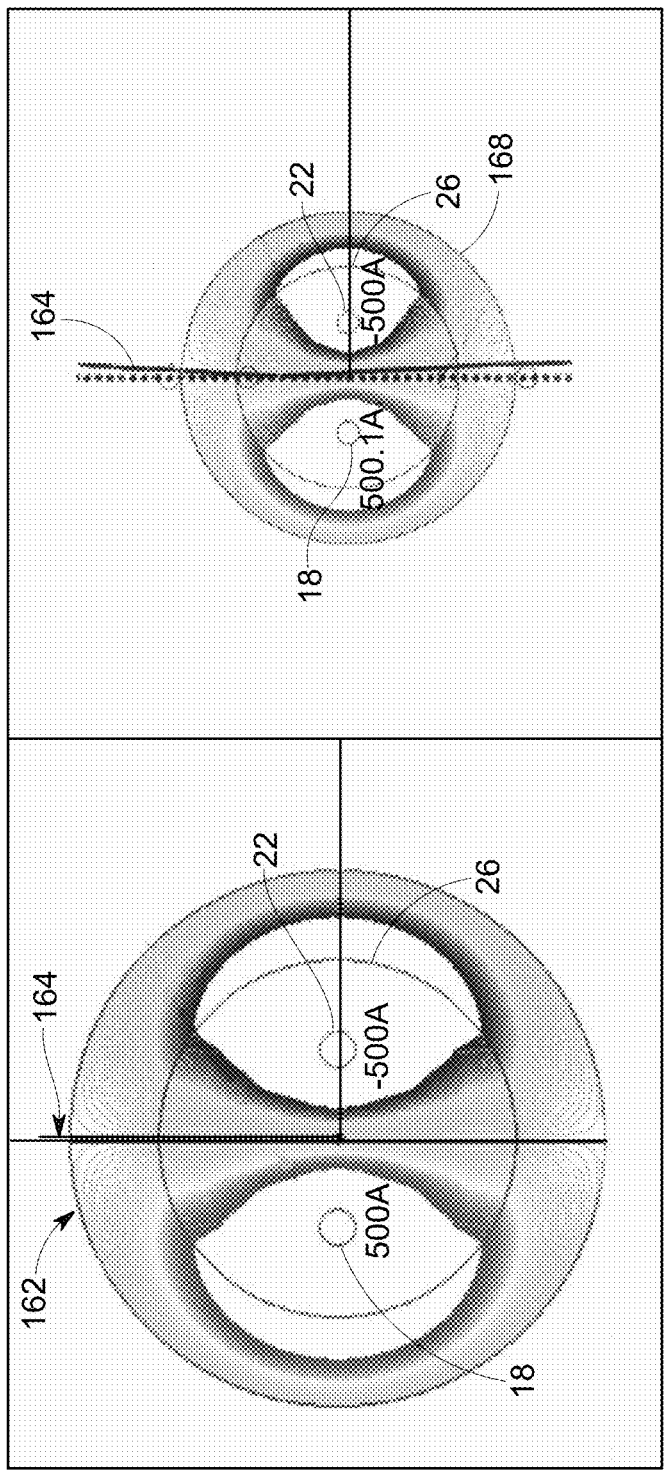
FIG. 5 is a cross sectional view of the magnetic flux created by current flowing in the wires of an AC motor or electric generator with no leakage current present in accordance with certain embodiments of the present disclosure.
FIG. 6 is a cross sectional view of the magnetic flux created by current flowing in the wires of an AC motor or electric generator with leakage current present in accordance with certain embodiments of the present disclosure.

To further clarify the leakage current discussion provided above, FIGS. 5 and 6 are cross-sectional views of the magnetic flux created by current flowing in a respective input cable 18 and output cable 22. In a case where there is no leakage current (FIG. 5), the input cable 18 may carry a current, such as 500 amperes, to the motor induction load 20. Since no current leaked out of the motor induction load 20, the same current (500 A) flows in the opposite direction on the respective output cable 22. Because the amplitude of the current flowing through the input cable 18 and the current flowing through the corresponding output cable 22 are equal, they generate a symmetric magnetic flux 162 about the input cable 18 and the output cable 22. An unchanging and symmetric magnetic flux 162 does not generate a voltage in the respective phase leakage transformer 26. A magnetic neutral axis (MNA) 164 may therefore exist where the magnetic fields attributable to the current flowing through the input cable 18 and the current flowing through the output cable 22 cancel each other out. In the case of no leakage current (FIG. 5), the MNA 164 may be approximately perpendicular to a line connecting the phase input cable 18 and the phase output cable 22.

In an example where a leakage current is present (FIG. 6), the input cable 18 may carry a current to the motor induction load 20. In this example, a leakage current 42 may be present in the motor load, such as due to damaged stator insulation 34. Thus, less current may flow on the phase output cable 22 due to the loss of this leakage current out of the load 20. For example, the input cable 18 may initially carry 500 amperes of current and the corresponding output cable 22 may also carry 500 amperes of current when no leakage current 42 is present. In one example, a leakage current of 100 mA occur due to reduced effectiveness of the stator insulation 34, and may result in an extra 100 mA being drawn through the input cable 18, thus resulting in a draw of 500.1 A through the input cable 18. After the 100 mA current leaks through the stator insulation 34, the remaining 500 mA may return on the respective output cable 22. Because the current flowing on the input cable 18 and the current flowing on the corresponding output cable 22 are not equal, they may create an asymmetric magnetic flux 168 surrounding the paired input cable 18 and output cable 22. The asymmetric magnetic flux 168 may result in a voltage being generated by the phase leakage transformer 26 that may be monitored. The MNA 164 may also be shifted towards the phase output cable 22 as shown in FIG. 6. It should be noted that although FIGS. 5 and 6 were described in relation to AC motors, the same principles apply to measuring the health of stator insulation in electric generators.

Figure 7:
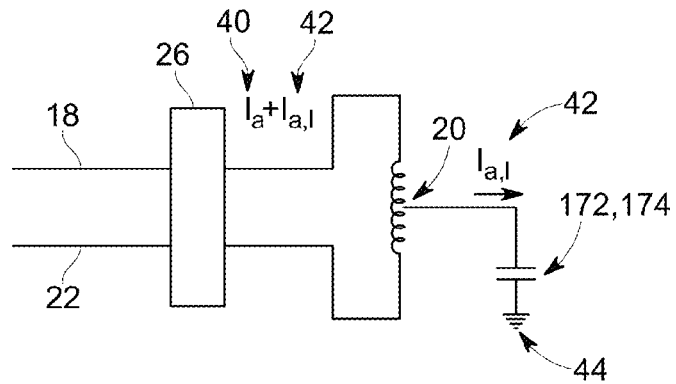
FIG. 7 is a diagram of a single phase circuit of the system of FIG. 1 in the case of healthy stator insulation with an equivalent leakage circuit through which leakage current flows to ground in accordance with certain embodiments of the present disclosure.
Figure 8:
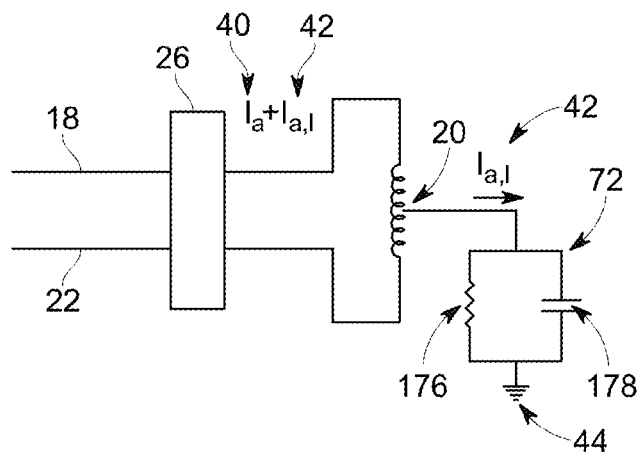
FIG. 8 is a diagram of a single phase circuit of the system of FIG. 1 in the case of aging stator insulation with an equivalent leakage circuit through which leakage current flows to ground in accordance with certain embodiments of the present disclosure.
Figure 9:
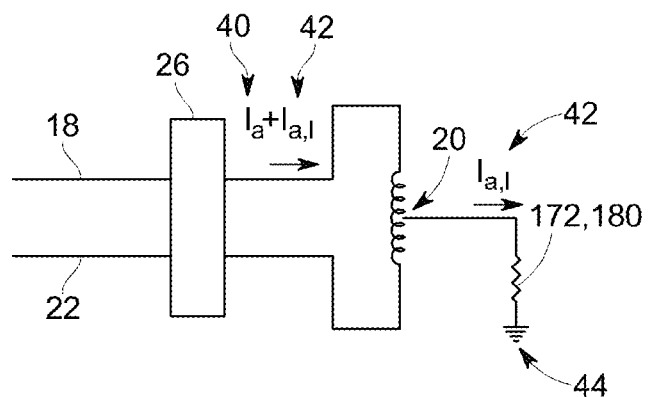
FIG. 9 is a diagram of a single phase circuit of the system of FIG. 1 in the case of damaged stator insulation with an equivalent leakage circuit through which leakage current flows to ground in accordance with certain embodiments of the present disclosure.

With the foregoing in mind, and turning now to FIG. 7, a single phase circuit of the AC motor 16 is depicted with an equivalent leakage circuit 172. In the depicted example, the leakage current 42 that may flow out of the motor induction load 20 may flow through an equivalent leakage circuit 172 and into the grounded frame 44 of the AC motor 16 or electric generator 48. The components of the equivalent leakage circuit 172 may change as the condition of the stator insulation 34 of the AC motor 16 or electric generator 48 changes. The diagrams in FIG. 7-9 show the changes in the equivalent leakage circuit 172 as the condition of the stator insulation 34 changes. FIG. 7, as discussed above, shows the equivalent leakage circuit 172 comprising a single capacitor 174 in the case of healthy stator insulation 34. In a situation where the stator insulation 34 is aging or otherwise deteriorating, as shown in FIG. 8, the equivalent leakage circuit 172 may be represented as a resistor 176 in parallel with a capacitor 178. As the stator insulation 34 ages, the resistance of the resistor 176 may decrease. As the resistance decreases, the leakage current 42 flowing through the equivalent leakage circuit 172 may increase. In damaged or degraded stator insulation 34, as shown in FIG. 9, the equivalent leakage circuit 172 may be represented simply as a resistor 180. As the stator insulation 34 becomes more damaged or further degrades, the resistance of the resistor 180 may decrease. As the resistance decreases, the leakage current 42 flowing through the equivalent leakage circuit 172 may continue to increase.

Figure 10:
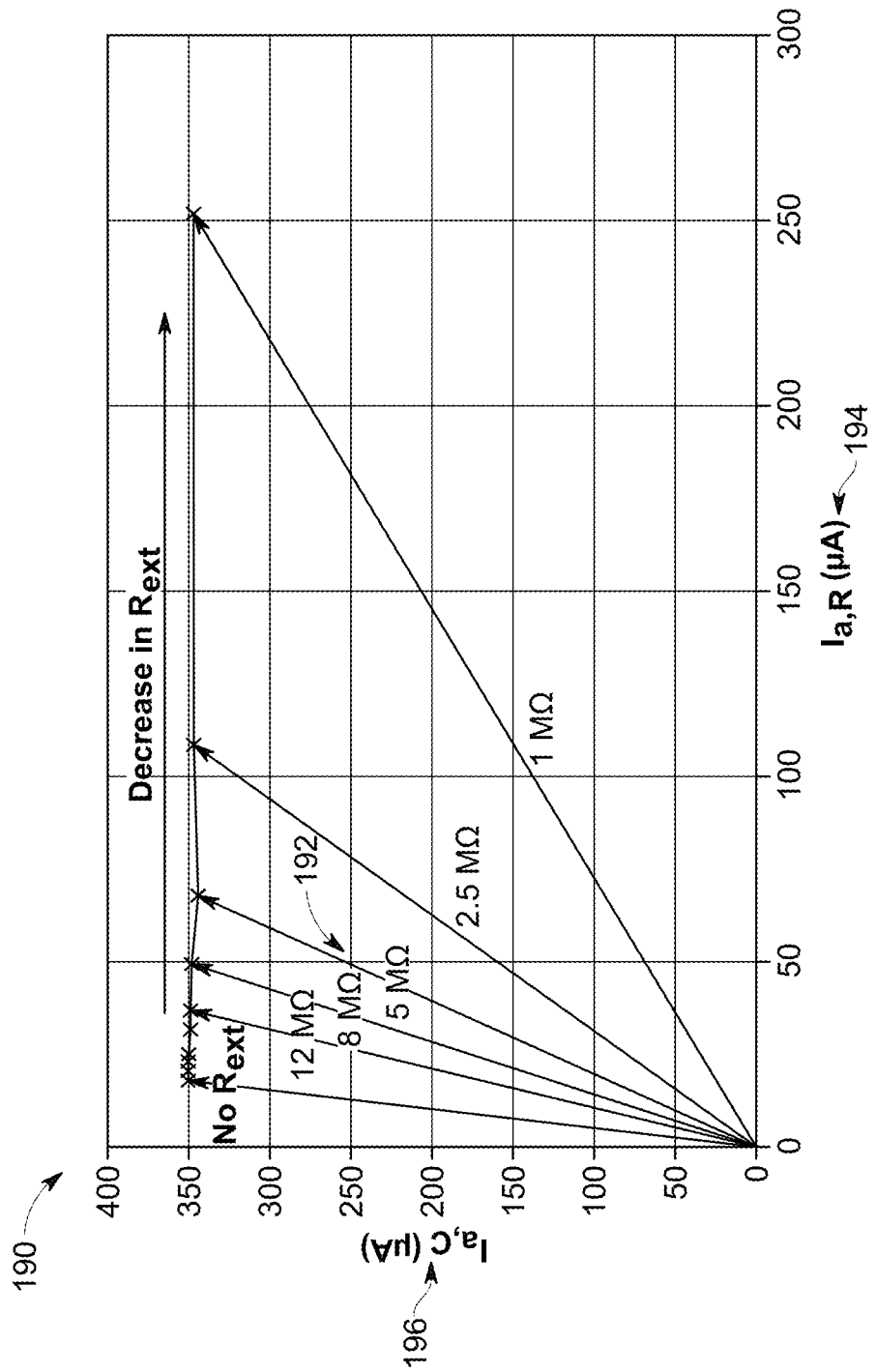
FIG. 10 is a graph showing how the current through a capacitive portion of stator insulation and a resistive portion of stator insulation relates to the equivalent impedance of stator insulation in accordance with certain embodiments of the present disclosure.

Turning to FIG. 10, a graph 190 is depicted detailing how the amount of current flowing through a capacitive portion of the equivalent leakage circuit 172 and a resistive portion of the equivalent leakage circuit 172 relate to an equivalent impedance 192 of the stator insulation 34 of an AC motor 16 or electric generator 48. The x-axis of the graph 190 corresponds to the amount of leakage current 42 flowing though the resistive portion of the equivalent leakage circuit 194. The y-axis of the graph 190 corresponds to the amount of leakage current 42 flowing through the capacitive portion of the equivalent leakage circuit 196. The amount of leakage current flowing through the capacitive portion of the equivalent leakage circuit 196 may remain approximately constant despite the condition of the stator insulation 34. As the condition of the stator insulation 34 degrades, the amount of leakage current flowing through the resistive portion of the equivalent leakage circuit 194 may increase. As the amount of leakage current flowing through the resistive portion of the equivalent leakage circuit 94 increases, the equivalent impedance 192 of the stator insulation 34 may decrease, and may allow more leakage current 42 to flow from the motor induction load 20 or the generator inductor 50 to ground. Because of this relationship, the equivalent impedance 192 of the stator insulation 34 may be used to diagnose the condition of the stator insulation 34. Additionally, the equivalent impedance 192 (e.g., 12 MΩ, 8 MΩ, 5 MΩ, etc. . . . ) of the stator insulation 34 may be used to offer a prognosis of insulation failures. Such a prognosis of insulation failures may include an estimated time that the stator insulation 34 can function without failing or an estimated time until replacement is needed.

With this in mind, FIG. 11 comprises a flowchart 200 showing the data collection and analysis process for stator insulation 34 monitoring in accordance with certain embodiments of the present disclosure. In particular, FIG. 11 depicts an example of a process in which one or more phase leakage transformers 26 are provided, with each phase leakage transformer 26 being positioned about a respective input cable 18 and output cable 22 corresponding to a particular power phase. As represented by block 202, the phase leakage transformers 26 may monitor the leakage current 42 flowing through the stator insulation 34 and into the grounded frame 44 of the AC motor 16 or electric generator 48. During normal operation of the AC motor 16, switching of power switches and high frequency voltage spikes in the power converter (drive) 14 may provide voltage excitation spikes at various frequencies to the inputs of the AC motor 16. As mentioned above, the phase leakage transformers 26 may monitor the leakage current 42 by generating transformer voltage signals 204 based on changes in magnetic flux caused by changes in leakage current 42. A microprocessor 28 may in turn receive the transformer voltage signals 204 as inputs (such as after conversion from an analog to digital signal), and process the transformer voltage signals 204 as represented by block 206. The microprocessor 28 may process the transformer voltage signals 204 to determine a capacitance and dissipation factor 208 value for the equivalent leakage circuit 172. Thus, the response of the leakage current 42 from voltage excitation at various frequencies may be used to determine the capacitance and dissipation factor 208. As represented by block 210, the microprocessor 28 may further process the capacitance and dissipation factor 208 to determine the status or condition of the stator insulation 212 for a specific phase and/or the expected lifetime of the stator insulation 214 for a specific phase.

FIG. 12 comprises a flowchart 220 showing the data collection and analysis process for common mode monitoring in accordance with certain embodiments of the present disclosure. As represented by block 222, a common-mode leakage transformer 24 may be positioned about the three input cables 18 running to the motor 16 and may monitor the leakage current 42 flowing through the stator insulation 34 and into the grounded frame 44 of the AC motor 16 or the electric generator 48. During normal operation of the AC motor 16, switching of power switches and high frequency voltage spikes in the power converter (drive) 14 may provide voltage excitation spikes at various frequencies to the inputs of the AC motor 16. As mentioned above, the common-mode leakage transformer 24 may monitor the leakage current 42 by generating transformer voltage signals 224 in response to changes in magnetic flux caused by changes in leakage current 42, as determined from monitoring the input cables 18. The microprocessor 28 may receive the transformer voltage signals 224 as inputs, and process the transformer voltage signals 224 as represented by block 226. The microprocessor 28 may process the transformer voltage signals 224 to determine a capacitance and dissipation factor 228 value for the equivalent leakage circuit 172. The response of the leakage current 42 from voltage excitation at various frequencies may be used to determine the capacitance and dissipation factor 228. As represented by block 230, the microprocessor 28 may process the capacitance and dissipation factor 228 to determine the status or condition of the stator insulation 232 and/or the expected lifetime of the stator insulation 234.

Technical effects of the invention include an electronic system configured to monitor the health of the stator insulation of an electric generator or a variable speed drive (VSD)-fed AC motor while the electric generator or VSD-fed AC motor is in operation. In certain implementations, the electronic system includes a common-mode leakage transformer used to generate a voltage based on changes in the total current feeding into the VSD-fed AC motor. The changes in current are due to current leaking from the circuitry of the VSD-fed AC motor to ground. Other implementations may include phase leakage transformers used to generate voltages based on changes in currents flowing through each phase circuit of the VSD-fed AC motor. The changes in current are due to current leaking from the circuitry of the VSD-fed AC motor to ground. Likewise, embodiments may include common-mode leakage transformers or phase leakage transformers utilized to monitor an electric generator with the same principles with which a VSD-fed AC motor is monitored. The electrical system monitoring the electric generator or the AC motor includes a microprocessor configured to monitor the voltages generated by the common-mode leakage transformer and the phase leakage transformers. The microprocessor is configured to determine a capacitance and dissipation factor of the stator insulation from the voltages, and give a diagnosis of the current health of the stator insulation and a prognosis of the remaining lifetime of the stator insulation based on the capacitance and dissipation factor values.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. An electronic system comprising:
   a first current transformer configured to enclose a first pair of phase cables of a variable speed drive (VSD) fed AC motor or an electric generator;
   a second current transformer configured to enclose a second pair of phase cables of the VSD-fed AC motor or the electric generator;
   a third current transformer configured to enclose a third pair of phase cables of the VSD-fed AC motor or the electric generator;
   power conversion circuitry comprising a common-mode transformer configured to enclose a set of phase cables comprising a first cable of the first pair of phase cables, a second cable of the second pair of phase cables, and a third cable of the third pair of phase cables; and
   a microcontroller configured to monitor respective voltages generated by the first, second, third, and common-mode transformers, and to determine insulation characteristics of the VSD-fed AC motor or the electric generator based on the monitored respective voltages.

2. The electronic system of claim 1, wherein the VSD-fed AC motor or the electric generator is in operation while the microcontroller monitors the insulation characteristics of the VSD-fed AC motor or the electric generator.

3. The electronic system of claim 1, wherein the microcontroller is continuously monitoring the insulation characteristics of the VSD-fed AC motor or the electric generator.

4. The electronic system of claim 1, wherein the first, second, and third transformers generate the respective voltages based on changes in a magnetic flux surrounding the respective first, second, or third pairs of phase cables.

5. The electronic system of claim 4, wherein the change in magnetic flux surrounding the respective first, second, and third pairs of phase cables is due to changes in current flowing through the first, second, or third pairs of phase cables.

6. The electronic system of claim 1, wherein the first, second, and third current transformers comprise high sensitivity differential current transformers, the common-mode transformer comprises a high sensitivity differential current transformer, or any combination thereof.

7. The electronic system of claim 1, wherein the insulation characteristics of the VSD-fed AC motor or the electric generator comprise a capacitance and a dissipation factor.

8. The electronic system of claim 7, wherein the microcontroller processes the capacitance and the dissipation factor of the VSD-fed AC motor or the electric generator to diagnose a condition of a stator insulation associated with the VSD-fed AC motor or the electric generator.

9. The electronic system of claim 7, wherein the microcontroller processes the capacitance and the dissipation factor of the VSD-fed AC motor or the electric generator to an expected remaining lifetime of the VSD-fed AC motor or the electric generator.

10. A method for monitoring a condition of insulation in an AC motor or an electric generator, comprising:
    enclosing a first pair of phase cables of the AC motor or the electric generator with a first transformer that generates a first voltage corresponding to a first leakage current, when present, in the first pair of phase cables;
    enclosing a second pair of phase cables of the AC motor or the electric generator with a second transformer that generates a second voltage corresponding to a second leakage current, when present, in the second pair of phase cables;
    enclosing a third pair of phase cables of the AC motor or the electric generator with a third transformer that generates a third voltage corresponding to a third leakage current, when present, in the third pair of phase cables;
    enclosing a set of phase cables with a common-mode transformer that generates a common-mode voltage corresponding to a common-mode leakage current, when present, in the set of phase cables, wherein the set of phase cables comprises a first cable of the first pair of phase cables, a second cable of the second pair of phase cables, and a third cable of the third pair of phase cables; and
    monitoring the first, second, third, and fourth voltages generated, respectively, by the first, second, third, and common-mode transformers with a microcontroller to determine the condition of the insulation in the AC motor or the electric generator.

11. The method of claim 10, wherein monitoring the first, second, third, and fourth voltages with the microcontroller occurs while the AC motor or the electric generator is in operation.

12. The method of claim 10, wherein monitoring the first, second, third, and fourth voltages with the microcontroller is continuous.

13. The method of claim 10, wherein the first, second, third, and common-mode transformers generate the respective voltages based on changes in magnetic flux surrounding the first pair, the second pair, the third pair, and the set of phase cables.

14. The method of claim 13, wherein the changes in magnetic flux surrounding the first pair, the second pair, the third pair, and the set of phase cables are due to changes in current flowing through the respective first pair, second pair, third pair, and set of phase cables.

15. The method of claim 10, wherein the wherein the first, second, and third current transformers comprise high sensitivity differential current transformers, the common-mode transformer comprises a high sensitivity differential current transformer, or any combination thereof.

16. The method of claim 10, wherein a health of the insulation of the AC motor is determined by the microcontroller at least in part by determining a capacitance and a dissipation factor of a stator insulation associated with the AC motor or the electric generator.

17. The method of claim 10 comprising monitoring the first, second, third, and fourth voltages generated, respectively, by the first, second, third, and common-mode transformers with the microcontroller to determine an expected remaining lifetime of the insulation in the AC motor or the electric generator.

* * * * *